United States Patent [19]

Ito

[11] Patent Number: 5,734,621
[45] Date of Patent: Mar. 31, 1998

[54] SEMICONDUCTOR MEMORY DEVICE

[75] Inventor: Nobuhiko Ito, Tenri, Japan

[73] Assignee: Sharp Kabushiki Kaisha, Japan

[21] Appl. No.: 748,022

[22] Filed: Nov. 12, 1996

[30] Foreign Application Priority Data

Dec. 1, 1995 [JP] Japan ................... 7-314499

[51] Int. Cl.$^6$ ................................. G11C 7/00
[52] U.S. Cl. ................. 365/230.03; 365/185.11; 365/185.33; 365/189.01
[58] Field of Search .............. 365/230.03, 189.04, 365/220, 194, 185.11, 185.33, 189.01

[56] References Cited

U.S. PATENT DOCUMENTS 5,245,572  9/1993  Kosonocky et al. ............ 365/185.11
5,305,281  4/1994  Lubeck .......................... 365/230.03
5,570,320  10/1996 Runas ........................... 365/230.03

FOREIGN PATENT DOCUMENTS 6-180999  6/1994  Japan.

Primary Examiner—Tan T. Nguyen
Attorney, Agent, or Firm—Morrison & Foerster LLP

[57] ABSTRACT

A semiconductor memory device includes: a first memory cell array and a second memory cell array for receiving a first control signal, a second control signal, and a third control signal so as to be controlled by the first control signal, the second control signal, and the third control signal. Data stored in the first memory cell array is read when the first control signal and the second control signal are placed in an enable state. Data stored in the second memory cell array is read when the second control signal and the third control signal are placed in an enable state.

14 Claims, 7 Drawing Sheets

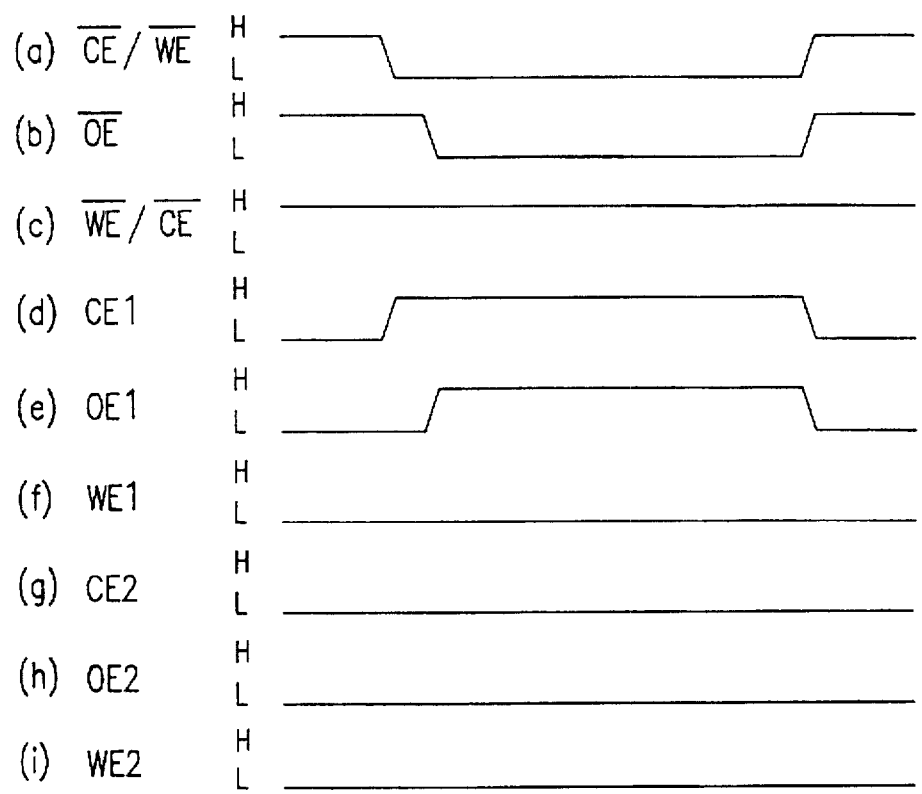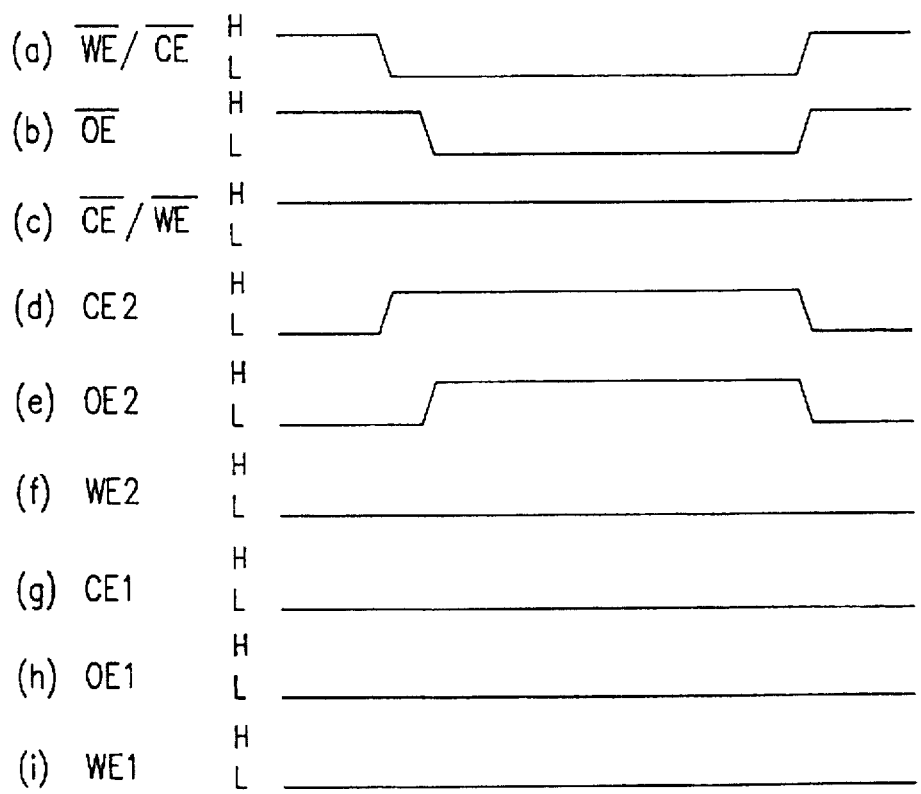

SEMICONDUCTOR MEMORY DEVICE

BACKGROUND OF THE INVENTION

1. Field of the Invention

The present invention relates to a semiconductor memory device, and more particularly to a semiconductor memory device including two memory cell arrays which are separately controllable.

2. Description of the Related Art

A conventional example of a semiconductor memory device including two separately-controllable memory cell arrays is disclosed in Japanese Laid-Open Patent Publication No. 6-180999. This semiconductor memory device is a non-volatile semiconductor memory device. FIG. 13 shows the structure of the non-volatile semiconductor memory device. As shown in FIG. 13, the non-volatile semiconductor memory includes a first memory cell array 31, a second memory cell array 32, and an input/output buffer (IOB) 30.

The first memory cell array 31 and the second memory cell array 32 are each configured as a flash EEPROM (electrically erasable and programmable read only memory). Each memory cell array 31 or 32 includes a dedicated address register (not shown) and a dedicated decoder (not shown). The memory cell arrays 31 and 32 share other peripheral circuitry common to the flash EEPROMs.

To each memory cell array 31 or 32, three kinds of control signals are supplied: a chip enable input ($\overline{CE}$), an output enable input ($\overline{OE}$), and a write enable input ($\overline{WE}$). These control signals are supplied to each memory cell array via control buses 33 from a CPU (not shown). The memory cell arrays 31 and 32 are separately controlled in accordance with these control signals $\overline{CE}$, $\overline{OE}$, and $\overline{WE}$. In other words, reading/writing/erasing is separately performed for each memory cell array 31 or 32.

Address information is provided for each memory cell array 31 or 32 via address buses A0 to A15. Furthermore, data corresponding to a given address is exchanged between each memory cell array 31 or 32 and a data bus 34.

In addition to the address buses A0 to A15, another address bus A16 is connected to the non-volatile semiconductor memory device. Specifically, one end of the address bus A16 is coupled to an input pin of each of the first and second memory cell arrays 31 and 32. Because of the address bus A16, it is possible to access one of the memory cell arrays 31 and 32 while programming the other memory cell array 31 or 32. In other words, the CPU is able to perform a task which requires access to the information stored in one of the memory cell arrays (31 or 32) while programming the other memory cell array (32 or 31), in accordance with this non-volatile semiconductor memory device.

A read operation of the above-mentioned non-volatile semiconductor memory device will be described with reference to FIG. 14. If a signal of "H" (high) level is input to the non-volatile semiconductor memory device via the address bus A16, the first memory cell array 31 is selected. If a signal of "L" (low) level is input to the non-volatile semiconductor memory device via the address bus A16, the second memory cell array 32 is selected. Thus, one of the memory cell arrays 31 and 32 is selected in accordance with the level (i.e., "H" or "L") of the signal input via the address bus A16.

After either memory cell array 31 or 32 has been selected, if the chip enable signal $\overline{CE}$ and the output enable signal $\overline{OE}$ are both active (or "L"), the data corresponding to the address information provided via the address buses A0 to A15 is read from the selected memory cell array 31 or 32.

A write operation of the above-mentioned non-volatile semiconductor memory device will be described with reference to FIG. 15. After either memory cell array 31 or 32 has been selected as described above, if the chip enable signal $\overline{CE}$ and the write enable signal $\overline{WE}$ are both active (or "L"), the data corresponding to the address information provided via the address buses A0 to A15 is written to the selected memory cell array 31 or 32.

However, the above-mentioned conventional non-volatile semiconductor memory device requires the further address bus A16 so that either memory cell array 31 or 32 is selectable, which in turn requires each of the memory cell arrays 31 and 32 to include a further external input pin corresponding to the address bus A16, thereby leading to the problem described below.

A typical flash EEPROM package with a capacity of 2M bits includes 32 pins, whereas a typical flash EEPROM package with a capacity of 4M bits includes 40 pins. Incorporating an additional pin in a 2M-bit flash EEPROM package thus requires a total of 33 pins, but a 33-pin package is not commercially acceptable. As a result, a 40-pin package is inevitably adopted, which results in a larger package size and a larger mount area. This presents a problem in mounting the non-volatile semiconductor memory device in a limited space available in various electronic appliances.

It is also possible to add control input pins to each memory cell array 31 or 32 to select either memory cell array 31 or 32 in accordance with a control signal, instead of adding the further address bus A16 and further external input pins to the memory cell arrays 31 and 32 as in the above-mentioned conventional example. However, the above-mentioned problem still exists for such a configuration because of the increased number of external input pins.

SUMMARY OF THE INVENTION

A semiconductor memory device according to the present invention includes: a first memory cell array and a second memory cell array for receiving a first control signal, a second control signal, and a third control signal so as to be controlled by the first control signal, the second control signal, and the third control signal. Data stored in the first memory cell array is read when the first control signal and the second control signal are placed in an enable state, and data stored in the second memory cell array is read when the second control signal and the third control signal are placed in an enable state.

In one embodiment of the invention, data is written to at least one of the first memory cell array and the second memory cell array in accordance with the first control signal and the third control signal.

In another embodiment of the invention, the first control signal, the second control signal, and the third control signal each take either a first state or a second state.

In still another embodiment of the invention, the data is allowed to be written to the first memory cell array substantially for a period of time from a point where the third control signal shifts from the first state to the second state until a point where the first control signal shifts from the first state to the second state.

In still another embodiment of the invention, the data is allowed to be written to the second memory cell array substantially for a period of time from a point where the first control signal shifts from the first state to the second state until a point where the third control signal shifts from the first state to the second state.

In still another embodiment of the invention, the first control signal is $\overline{CE}/\overline{WE}$; the second control signal is $\overline{OE}$; and the third control signal is $\overline{WE}/\overline{CE}$.

In still another embodiment of the invention, the semiconductor memory device further includes a first internal control signal generation circuit and a second internal control signal generation circuit for receiving the first control signal, the second control signal, and the third control signal, wherein the first internal control signal generation circuit controls the first memory cell array in accordance with at least two of the first control signal, the second control signal, and the third control signal; and the second internal control signal generation circuit controls the second memory cell array in accordance with at least two of the first control signal, the second control signal, and the third control signal.

In still another embodiment of the invention, the first memory cell array and the second memory cell array are a flash RAM and a mask ROM.

In still another embodiment of the invention, the first memory cell array and the second memory cell array are a DRAM and a ROM.

In still another embodiment of the invention, the first memory cell array and the second memory cell array are an SRAM and a ROM.

In still another embodiment of the invention, the first memory cell array and the second memory cell array are a SRAM and a mask ROM.

In still another embodiment of the invention, the first memory cell array and the second memory cell array are a DRAM and a DRAM.

In still another embodiment of the invention, the first memory cell array and the second memory cell array are an SRAM and an SRAM.

In still another embodiment of the invention, the first memory cell array and the second memory cell array are a ROM and a ROM.

In accordance with the semiconductor memory device having the above configuration, it is possible to access one memory cell array for reading, writing, or erasing data therein while programming the other memory cell array simply by incorporating three control input pins in memory cell arrays for receiving first to third control signal inputs, i.e., without increasing the number of control input pins required in conventional non-volatile semiconductor memory devices and without adding any further address buses or further external input pins corresponding to such address buses in each memory cell array.

Thus, in accordance with the semiconductor memory device of the present invention, there is no need to add further external input pins or further control input pins, thereby making it possible to use conventionally available packages for the semiconductor memory device according to the specific number of pins required.

The above-mentioned advantage of the present invention is also attained by using any of the following combinations for the first memory cell array and the second memory cell array:

i) a RAM and a ROM (e.g., DRAM/ROM, SRAM/ROM, flash RAM/ROM, DRAM/mask ROM, SRAM/mask ROM, or flash RAM/mask ROM);

ii) two RAMs (e.g., DRAM/DRAM, SRAM/SRAM, flash RAM/flash RAM, DRAM/SRAM, flash RAM/DRAM, or flash RAM/SRAM); and iii) two ROMs (e.g., mask ROM/mask ROM)

In any such combination of memories, there is no need for adding further external input pins.

Thus, the invention described herein makes possible the advantage of providing a semiconductor memory device in which it is possible to access one of a pair of memory cell arrays while programming the other memory cell array without adding any further external input pins, such a semiconductor memory device being easily mountable in various electronic appliances without increasing its mount area.

This and other advantages of the present invention will become apparent to those skilled in the art upon reading and understanding the following detailed description with reference to the accompanying figures.

BRIEF DESCRIPTION OF THE DRAWINGS

FIG. 3 is a timing diagram illustrating the timing for reading data from a memory cell array 1.

FIG. 4 is a timing diagram illustrating the timing for reading data from a memory cell array 2.

DESCRIPTION OF THE PREFERRED EMBODIMENTS (Example 1)

Figure 1:
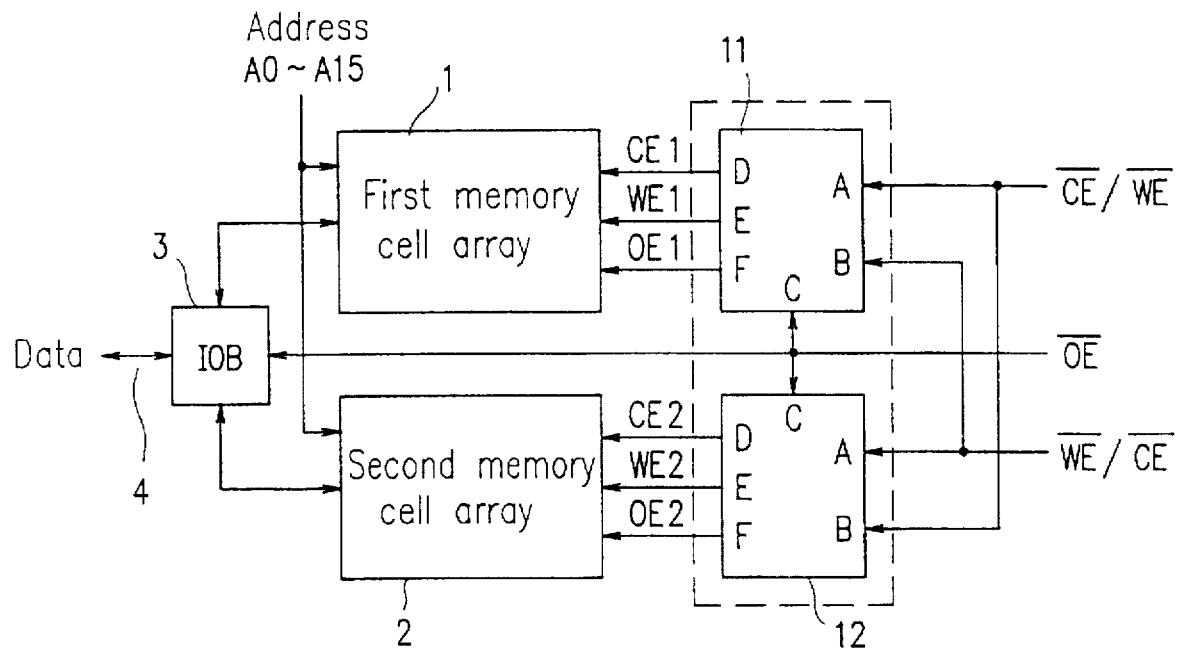
FIG. 1 is a block diagram showing the configuration of the semiconductor memory device according to an example of the present invention.

FIG. 1 shows a semiconductor memory device according to Example 1 of the present invention. The semiconductor memory device includes a first memory cell array 1, a second memory cell array 2, a first internal control signal generation circuit 11, a second internal control signal generation circuit 12, and an input/output buffer(IOB) 3.

The first memory cell array 1 and the second memory cell array 2 are each configured as a flash EEPROM. Each memory cell array 1 or 2 includes a dedicated address register (not shown) and a dedicated decoder (not shown). The memory cell arrays 1 and 2 can share other peripheral circuitry common to the flash EEPROMs.

The first internal control signal generation circuit 11 controls the first memory cell array 1 in accordance with a control instruction from a CPU (not shown), for example. Similarly, the second internal control signal generation circuit 12 controls the second memory cell array 2 in accordance with a control instruction. The internal control signal generation circuits 11 and 12 each includes control input pins (control input terminals) A, B, and C. Each control input pin C of the internal control signal generation circuits 11 and 12 receives a signal $\overline{OE}$. The control input pin A of the first internal control signal generation circuit 11 and the control input pin B of the second internal control signal generation circuit 12 receive a signal $\overline{CE/WE}$. The control input pin A of the second internal control signal generation circuit 12 and the control input pin B of the first internal control signal generation circuit 11 receive a signal $\overline{WE/CE}$.

Based on the received signals, the first internal control signal generation circuit 11 outputs signals CE1, WE1, and OE1 to the first memory cell array 1 via output terminals D, E, and F, respectively. Similarly, the second internal control signal generation circuit 12 outputs signals CE2, WE2, and OE2 to the second memory cell array 2 via output terminals D, E, and F, respectively. Furthermore, address information is supplied to each of the memory cell arrays 1 and 2 via address buses A0 to A15.

Each memory cell array 1 (or 2) performs reading/writing/erasing in accordance with the signals CE1 (or CE2), WE1 (or WE2), and OE1 (or OE2) as well as the address information.

Herein, the signal CE1 is a chip enable signal for the first memory cell array 1, and the signal CE2 is a chip enable signal for the second memory cell array 2. The signal WE1 is a write enable signal for the first memory cell array 1, and the signal WE2 is a write enable signal for the second memory cell array 2. The signal OE1 is a output enable signal for the first memory cell array 1, and the signal OE2 is a output enable signal for the second memory cell array 2.

The IOB 3 exchanges data of a given address between each memory cell array 1 or 2 and a data bus 4.

Figure 2:
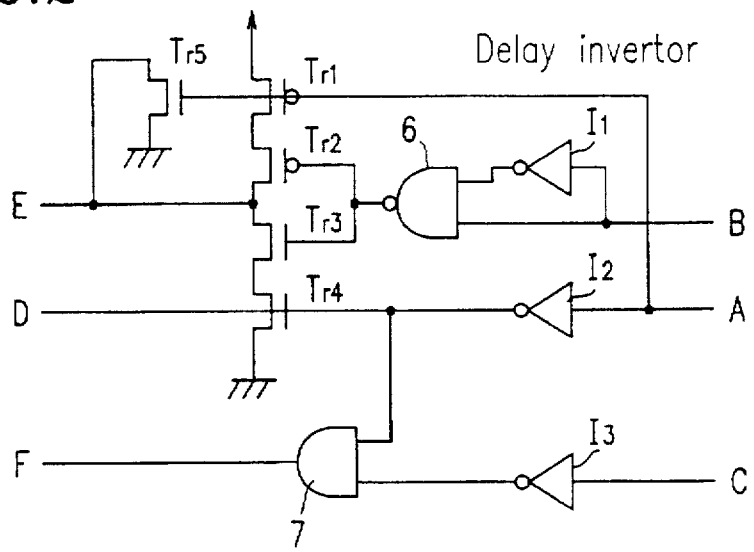
FIG. 2 is a circuit diagram showing an internal control signal generation circuit in detail.

The first and second internal control signal generation circuits 11 and 12 have the same configuration. As shown in FIG. 2, each of the internal control signal generation circuits 11 and 12 includes invertors I1, I2, and I3, a NAND circuit 6, an AND circuit 7, a p-type transistor Tr1 and Tr2, and n-type transistors Tr3, Tr4, and Tr5. The invertor I1, whose output is coupled to one of the input terminals of the NAND circuit 6, functions as a delay invertor. The other input terminal of the NAND circuit 6 is coupled to the control input pin B and an input terminal of the invertor I1.

The delay time of the delay invertor I1 defines the width of the internal WE signals (i.e., WE1, WE2) during writing, as described later. In other words, the write times of the internal WE signals (i.e., WE1, WE2) can be predetermined by predetermining the delay time of the delay invertor I1. The delay invertors I2 and I3 also generate delay.

In accordance with the above configuration, the reading/writing of data is performed for the memory cell arrays 1 and 2 according to the following timing scheme.

First, the timing for reading data from the first memory cell array 1 will be described with reference to FIG. 3. As the signal $\overline{CE/WE}$ (input from the CPU or the like to the first internal control signal generation circuit 11) shifts to the "L" level (i.e., the "enable" state) at the time shown in (a) of FIG. 3, the signal CE1 shifts to the "H" level as shown in (d) of FIG. 3. As the signal $\overline{OE}$ (input from the CPU or the like to the first internal control signal generation circuit 11) shifts to the "L" level (i.e., the "enable" state) at the time shown in (b) of FIG. 3, the signal OE1 shifts to the "H" level as shown in (e) of FIG. 3. When both signals CE1 and OE1 are at the "H" level, the data in the first memory cell array 1 is read.

During the above period, the signal $\overline{WE/CE}$ (input to the control input pin A of the second memory cell array 2) is maintained at the "H" level, i.e., the "disable" state, as shown in (c) of FIG. 3. As a result, the signals CE2, WE2, and OE2 are all maintained at the "L" level as shown in (g), (h), and (i) of FIG. 3, so that the data in the second memory cell array 2 is not accessed. It will be appreciated that the signal WE1 is maintained at the "L" level as shown in (f) of FIG. 3 during this read operation.

On the other hand, the timing for reading data from the second memory cell array 2 is illustrated in FIG. 4. As the signal $\overline{WE/CE}$ (input from the CPU or the like to the second internal control signal generation circuit 12) shifts to the "L" level (i.e., the "enable" state) at the time shown in (a) of FIG. 4, the signal CE2 shifts to the "H" level as shown in (d) of FIG. 4. As the signal $\overline{OE}$ (input from the CPU or the like to the second internal control signal generation circuit 12) shifts to the "L" level (i.e., the "enable" state) at the time shown in (b) of FIG. 4, the signal OE2 shifts to the "H" level as shown in (e) of FIG. 4. When both signals CE2 and OE2 are at the "H" level, the data in the second memory cell array 2 is read.

During the above period, the signal $\overline{CE/WE}$ (input to the control input pin A of the first memory cell array 1) is maintained at the "H" level, i.e., the "disable" state, as shown in (c) of FIG. 4. As a result, the signals CE1, WE1, and OE1 are all maintained at the "L" level as shown in (g), (h), and (i) of FIG. 4, so that the data in the first memory cell array 1 is not accessed.

Next, the timing for writing data to the first memory cell array 1 will be described with reference to FIG. 5. It is assumed that the $\overline{CE/WE}$ shifts to the "L" level at the time shown in (a) of FIG. 5.

Figure 5:
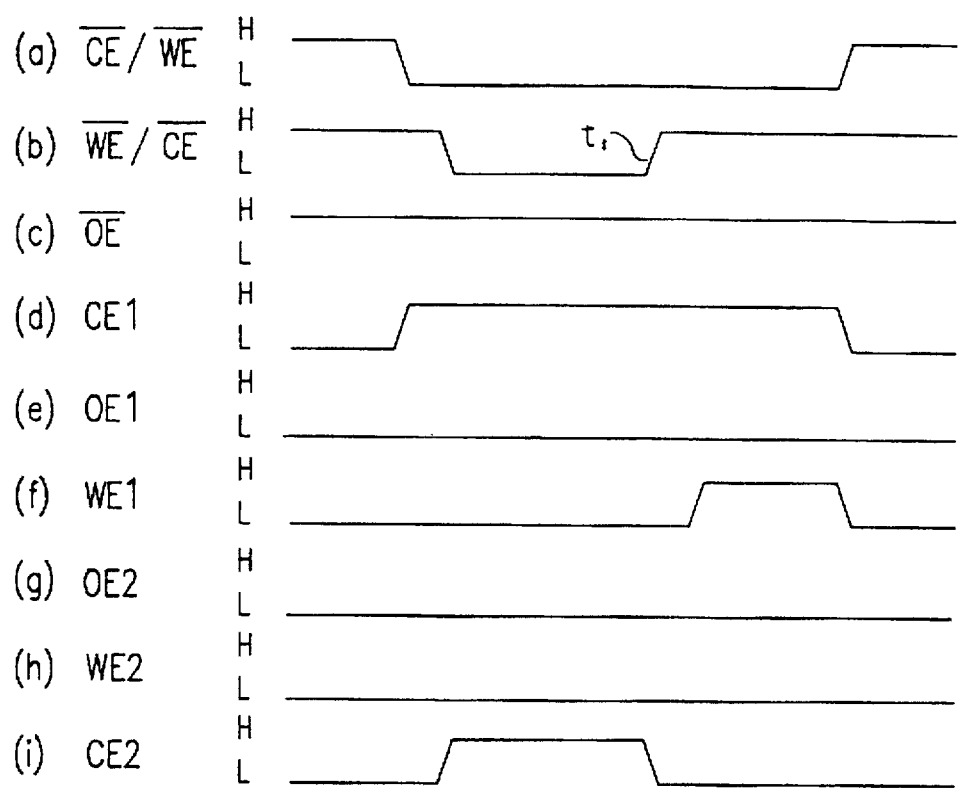
FIG. 5 is a timing diagram illustrating the timing for writing data to the memory cell array 1.

As the signal $\overline{WE/CE}$ rises from the "L" level to the "H" level (at point t1 shown in (b) of FIG. 5), the rising edge is detected by the first internal control signal generation circuit 11. In response to each detected rising edge of the signals $\overline{WE/CE}$ and $\overline{CE/WE}$, the level of the signal WE1 is varied. Specifically, the signal WE1 remains at the "H" level from a point that is a predetermined time after the point where the signal $\overline{WE/CE}$ shifts to the H level, until the signal $\overline{CE/WE}$ shifts to the H level, as shown in (f) of FIG. 5. The predetermined time is determined by the delay time of the invertor I1. Writing to the first memory cell array 1 is enabled during the above period where the signal WE1 is maintained at the H level. Thus, data is written to the first memory cell array 1. In the case where the delay time is substantially negligible, the above period can be considered as the period from the point where the signal $\overline{WE/CE}$ shifts to the H level until the signal $\overline{CE/WE}$ shifts to the H level.

In the above write cycle, the signal $\overline{CE/WE}$ never rises to the "H" level while the signal $\overline{WE/CE}$ is maintained at the "L" level, so that the signal WE2 is maintained at the "L" level. Therefore, data is not written to the second memory cell array 2 while data is written to the first memory cell array 1. Moreover, the signal OE2 is maintained at the "L" level, so that data is not read from the second memory cell array 2. Furthermore, the signal CE2 output to the second memory cell array 2 is obtained by inverting the signal $\overline{WE/CE}$. Therefore, the second memory cell array 2 is not accessed during this cycle.

Figure 6:
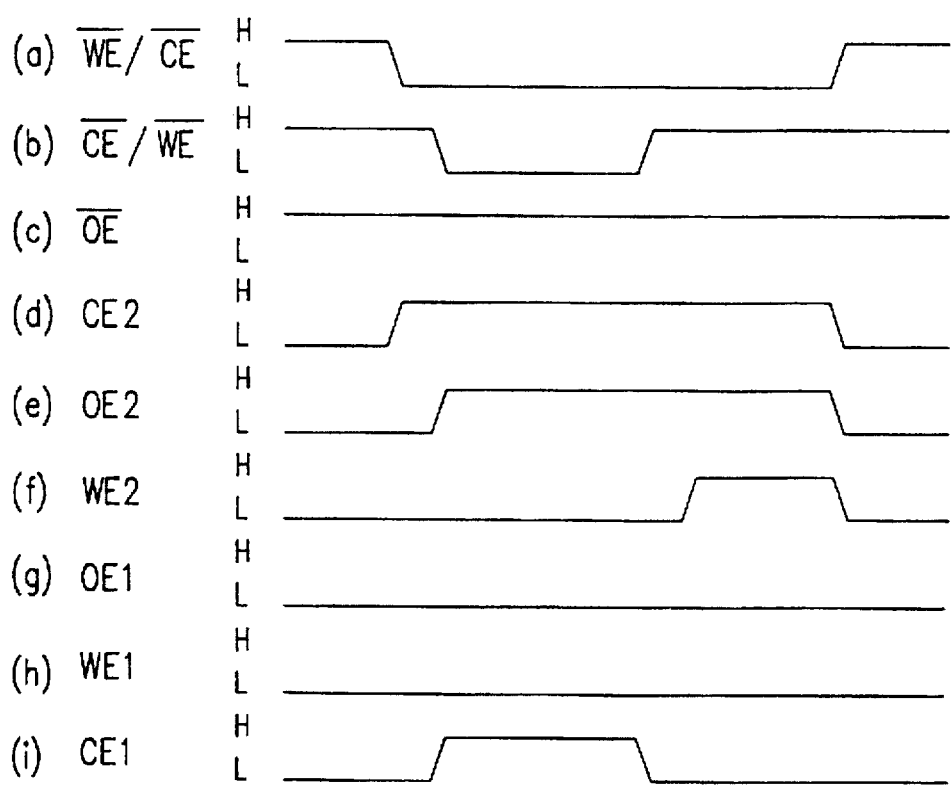
FIG. 6 is a timing diagram illustrating the timing for writing data to the memory cell array 2.

The timing for writing data to the second memory cell array 2 is illustrated in FIG. 6. It is assumed that the $\overline{WE/CE}$ shifts to the "L" level at the time shown in (a) of FIG. 6.

As the signal $\overline{CE/WE}$ rises from the "L" level to the "H" level (shown in (b) of FIG. 6), the rising edge is detected by the second internal control signal generation circuit 12. In response to each detected rising edge of the signals $\overline{CE/WE}$ and $\overline{WE/CE}$, the level of the signal WE2 is varied. Specifically, the signal WE2 remains at the "H" level from a point that is a predetermined time after the point where the signal $\overline{CE/WE}$ shifts to the H level, until the signal $\overline{WE/CE}$ shifts to the H level, as shown in (f) of FIG. 6. The predetermined time is determined by the delay time of the invertor I1. Writing to the second memory cell array 2 is enabled during the above period where the signal WE2 is maintained at the H level. Thus, data is written to the second memory cell array 2. In the case where the delay time is substantially negligible, the above period can be considered as the period from the point where the signal $\overline{CE/WE}$ shifts to the H level until the signal $\overline{WE/CE}$ shifts to the H level.

In the above write cycle, the signal $\overline{WE/CE}$ never rises to the "H" level while the signal $\overline{CE/WE}$ is maintained at the "L" level, so that the signal WE1 is maintained at the "L" level. Therefore, data is not written to the first memory cell array 1 while data is written to the second memory cell array 2. Moreover, the signal OE1 is maintained at the "L" level, so that data is not read from the first memory cell array 1. Furthermore, the signal CE1 output to the first memory cell array 1 is obtained by inverting the signal $\overline{CE/WE}$. Therefore, the first memory cell array 1 is not accessed during this cycle.

In accordance with the semiconductor memory device having the above-mentioned configuration incorporating the internal control signal generation circuits 11 and 12, each of the memory cell arrays 1 and 2 can be controlled in accordance with three kinds of control signals, i.e., $\overline{CE/WE}$, $\overline{OE}$, and $\overline{WE/CE}$ (supplied from a CPU or the like), without adding any external input pins.

(Example 2)

Figure 7:
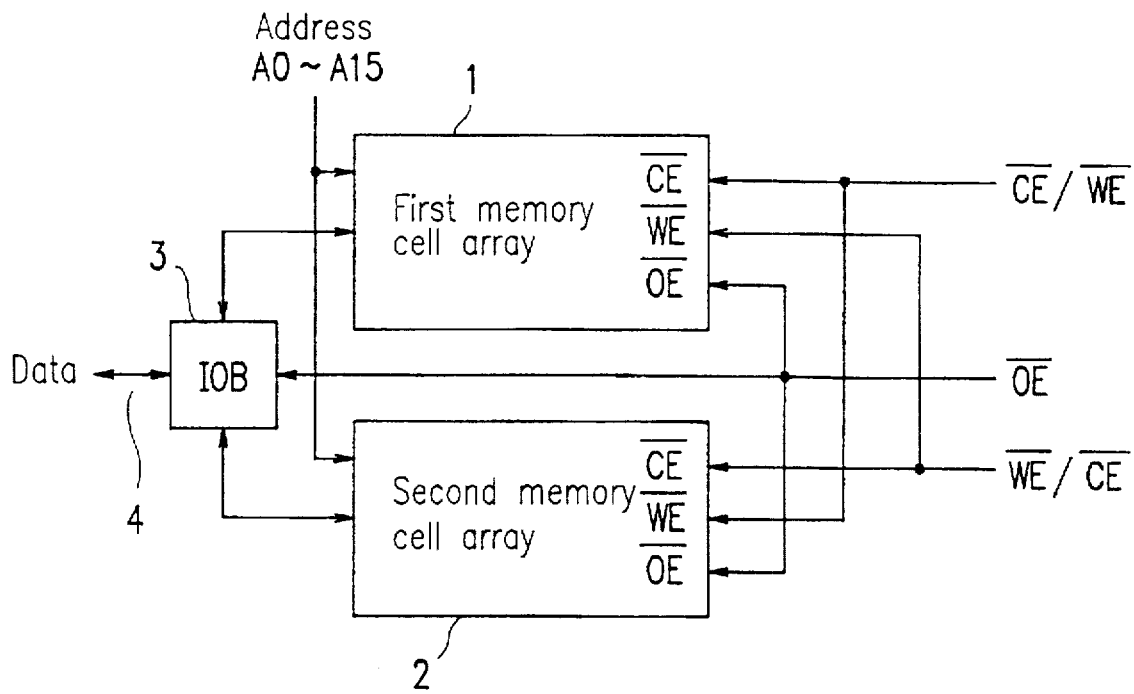
FIG. 7 is a block diagram showing the configuration of the semiconductor memory device according to a second example of the present invention.

FIG. 7 shows a semiconductor memory device according to Example 2 of the present invention. The semiconductor memory device does not include any internal control signal generation circuits, but separately controls memory cell arrays 1 and 2 in accordance with commands from a CPU (not shown). Therefore, the memory cell arrays 1 and 2 of the present example are configured as memory devices such as flash RAMs, for which writing/erasing can be controlled based on predetermined commands.

As shown in FIG. 7, the memory cell arrays 1 and 2 include control input pins (control input terminals) $\overline{CE}$, $\overline{WE}$, and $\overline{OE}$. A $\overline{CE/WE}$ signal, which is a control signal from the CPU or the like, is supplied to the control input pin $\overline{CE}$ of the first memory cell array 1 and the control input pin $\overline{WE}$ of the second memory cell array 2. A $\overline{WE/CE}$ signal, which is a control signal from the CPU or the like, is supplied to the control input pin $\overline{WE}$ of the first memory cell array 1 and the control input pin $\overline{CE}$ of the second memory cell array 2.

As the control signal $\overline{CE/WE}$ is set to the "L" level, only the first memory cell array 1 is placed in the "enable" state. By further setting the control signal $\overline{OE}$ to the "L" level, reading of data from the first memory cell array 1 is enabled.

As the control signal $\overline{WE/CE}$ is set to the "L" level, only the second memory cell array 2 is placed in the "enable" state. By further setting the control signal $\overline{OE}$ to the "L" level, reading of data from the second memory cell array 2 is enabled.

By setting both control signals $\overline{CE/WE}$ and $\overline{WE/CE}$ at the "L" level, writing to both memory cell arrays 1 and 2 is enabled. A write or erase operation is performed in response to a command input by a CPU or the like in this state. By ensuring that the first memory cell array 1 and the second memory cell array 2 respond to mutually different write/erase operation commands, it becomes possible to cause only one of the memory cell arrays 1 and 2 to perform a write/erase operation at a given time.

For example, the write command for the first memory cell array 1 can be [7:0]=40H; the write command for the second memory cell array 2 can be [7:0]=41H; the erase command for the first memory cell array 1 can be [7:0]=20H; and the erase command for the second memory cell array 2 can be [7:0]=21H.

Assuming that both control signals $\overline{CE/WE}$ and $\overline{WE/CE}$ are set at the "L" level in the above case, the first memory cell array 1 can be placed in a write mode by inputting the command 40H, which is ignored by the second memory cell array 2. Thus, a write operation is performed only for the first memory cell array 1.

Assuming that both control signals $\overline{CE/WE}$ and $\overline{WE/CE}$ are set at the "L" level in the above case, the second memory cell array 2 can be placed in a write mode by inputting the command 41H, which is ignored by the first memory cell array 1. Thus, a write operation is performed only for the second memory cell array 2.

Assuming that both control signals $\overline{CE/WE}$ and $\overline{WE/CE}$ are set at the "L" level in the above case, the first memory cell array 1 can be placed in an erase mode by inputting the command 20H, which is ignored by the second memory cell array 2. Thus, an erase operation is performed only for the first memory cell array 1.

Assuming that both control signals $\overline{CE/WE}$ and $\overline{WE/CE}$ are set at the "L" level in the above case, the second memory cell array 2 can be placed in an erase mode by inputting the command 21H, which is ignored by the first memory cell array 1. Thus, an erase operation is performed only for the second memory cell array 2.

(Example 3)

Figure 8:
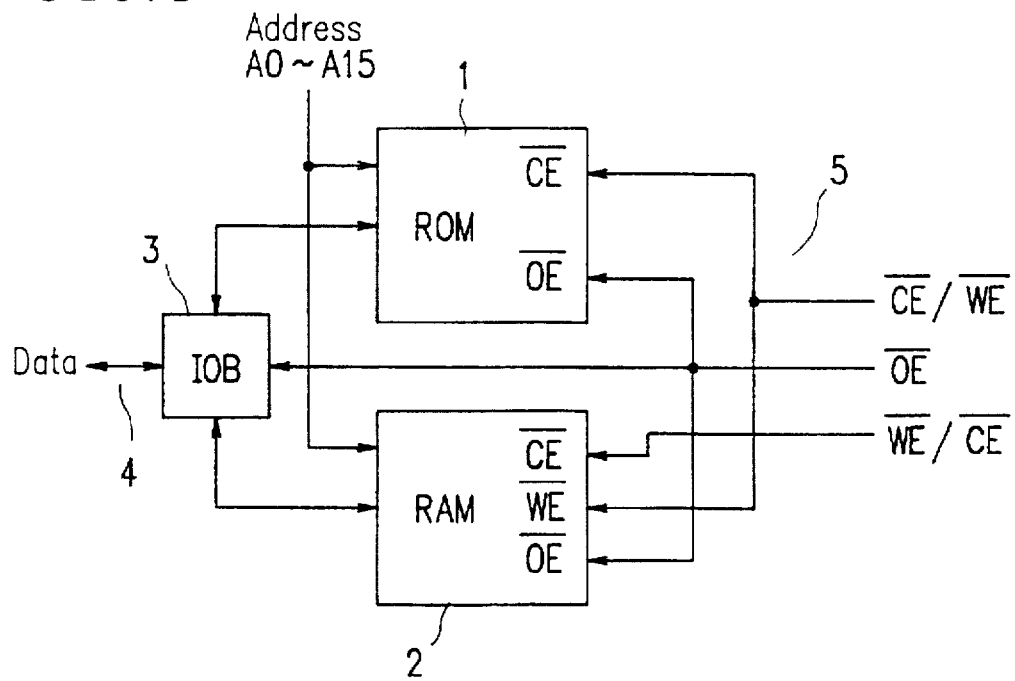
FIG. 8 is a block diagram showing the configuration of the semiconductor memory device according to a third example of the present invention.

FIG. 8 shows a semiconductor memory device according to Example 3 of the present invention. The semiconductor memory device includes a ROM as a first memory cell array 1 and a RAM as a second memory cell array 2. As seen from FIG. 8, a control signal $\overline{WE/CE}$ is not coupled to the first memory cell array 1 because a ROM does not usually include a control input terminal for receiving a write enable signal $\overline{WE}$.

Figure 9:
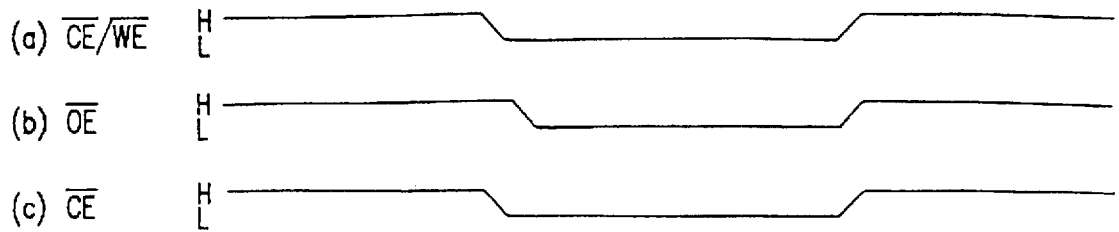
FIG. 9 is a timing diagram illustrating the timing for reading data from a ROM as the memory cell array 1.
Figure 10:
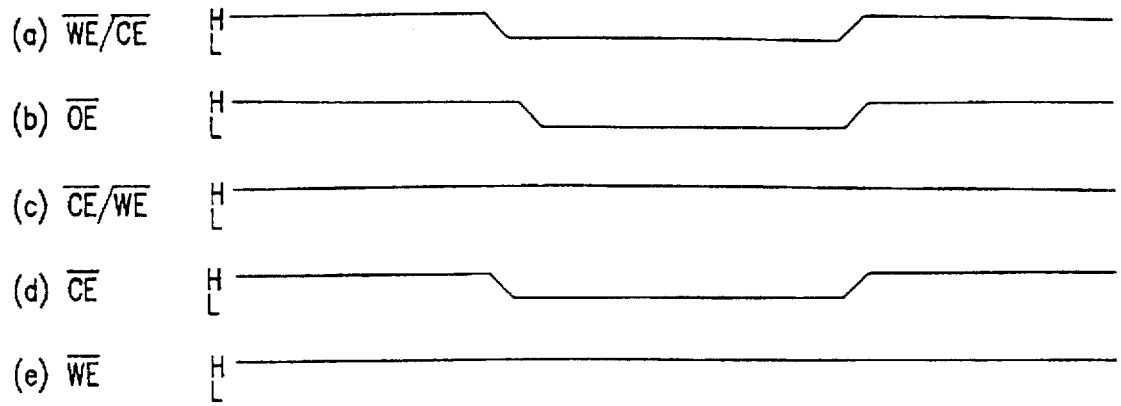
FIG. 10 is a timing diagram illustrating the timing for reading data from a RAM (random access memory) as the memory cell array 2.
Figure 11:
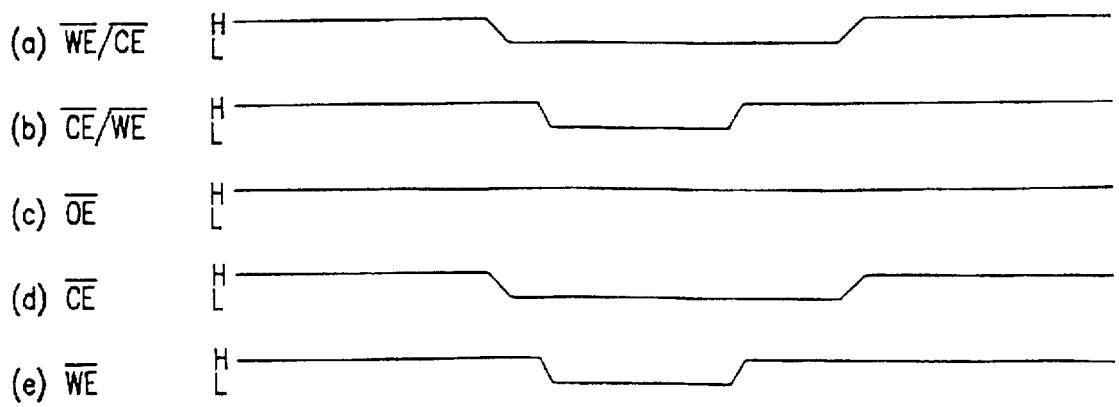
FIG. 11 is a timing diagram illustrating the timing for writing data to a RAM as the memory cell array 2.

FIG. 9 illustrates a read operation for the first memory cell array (ROM) 1. FIG. 10 illustrates a read operation for the second memory cell array (RAM) 2. FIG. 11 illustrates a write operation for the second memory cell array (RAM) 2.

As shown in FIG. 9, as the control signal $\overline{CE/WE}$ shifts to the "L" level (i.e., the "enable" state), the control signals $\overline{OE}$ and $\overline{CE}$ for the first memory cell array 1 shift to the "L" level at the times shown in (b) and (c) of FIG. 9, respectively. As a result, data can be read from the first memory cell array 1.

As shown in FIG. 10, as the control signal $\overline{WE/CE}$ shifts to the "L" level (i.e., the "enable" state), the control signals $\overline{OE}$ and $\overline{CE}$ for the second memory cell array 2 shift to the "L" level at the times shown in (b) and (d) of FIG. 10, respectively. As a result, data can be read from the second memory cell array 2. At this time, data is not read from the first memory cell array 1 because the control signal CE/WE is maintained at the "H" level.

As shown in FIG. 11, as the control signal WE/CE shifts to the "L" level (i.e., the "enable" state), the control signals CE and WE for the second memory cell array 2 shift to the "L" level at the times shown in (d) and (e) of FIG. 11, respectively. As a result, data can be written to the second memory cell array 2.

In addition to the combination of a ROM and a RAM described herein, a combination of two RAMs or two ROMs is also possible. Examples of suitable RAMs include flash RAMs, DRAMs, and SRAMs. Examples of suitable ROMs include mask ROMs and conventional ROMs.

(Example 4)

Figure 12:
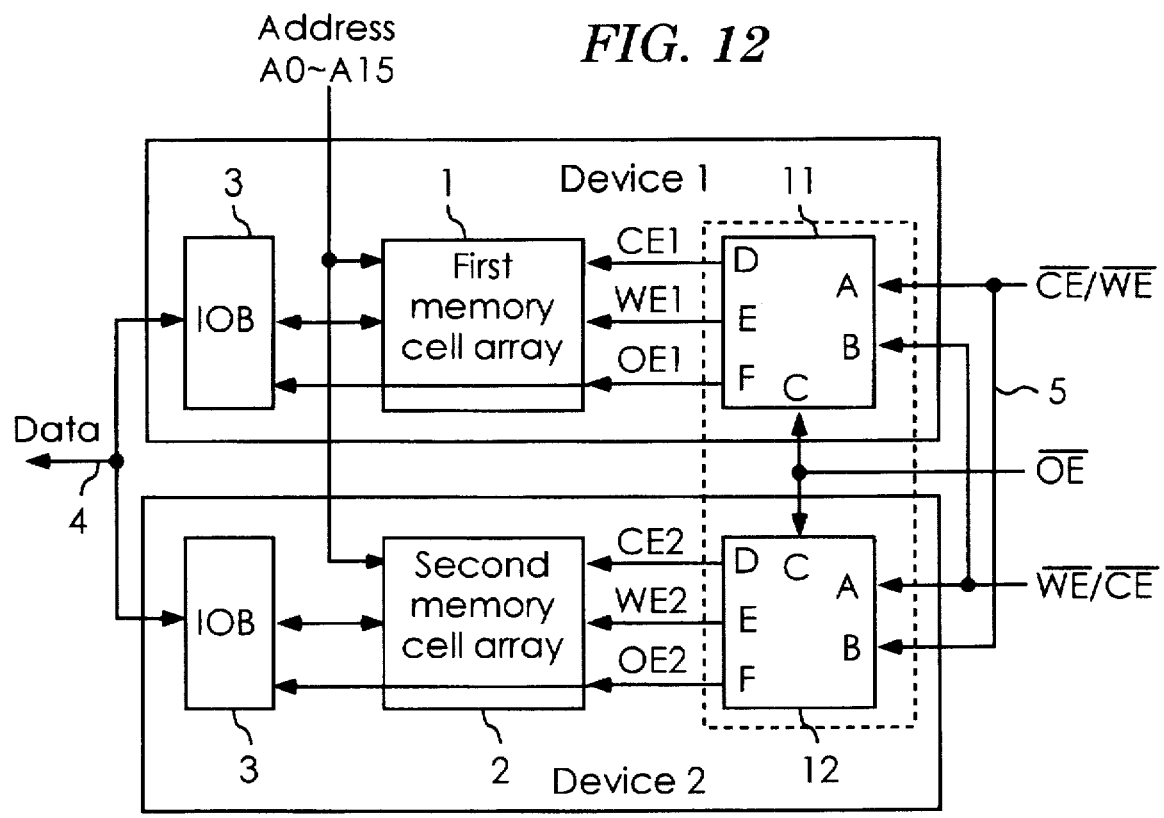
FIG. 12 shows an exemplary embodiment of a package incorporating the semiconductor memory device of the present invention.
Figure 13:
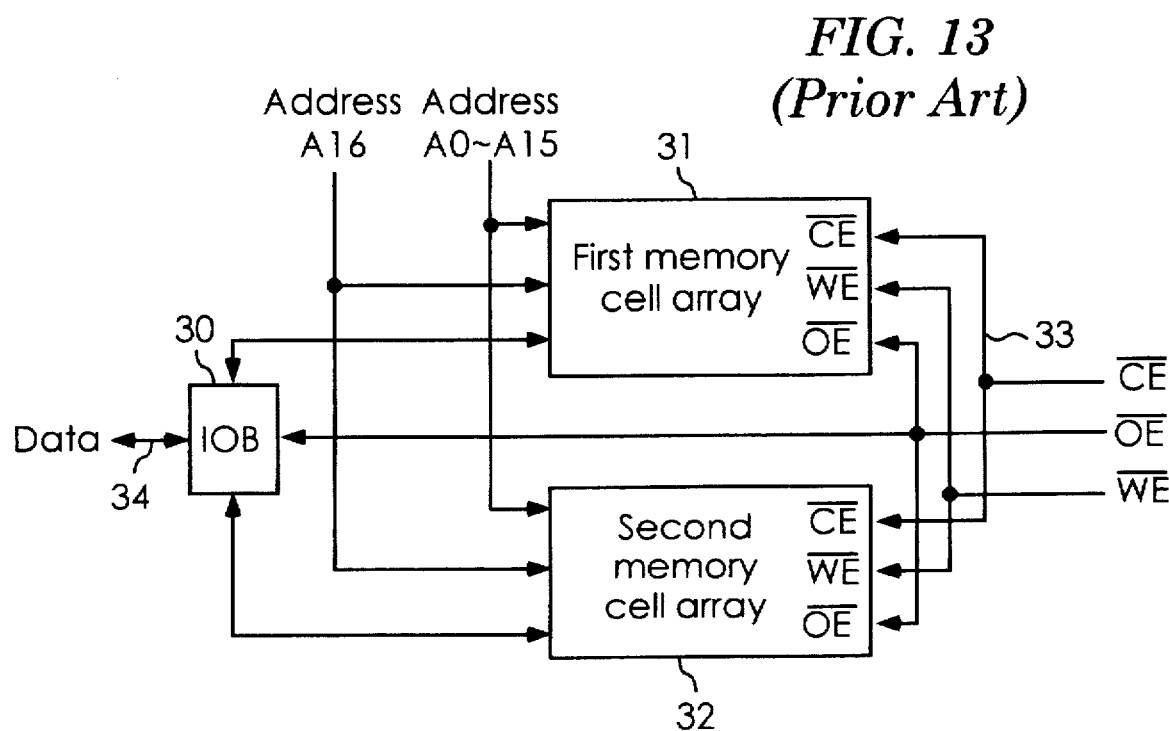
FIG. 13 is a block diagram showing the configuration of a conventional non-volatile semiconductor memory device.
Figure 14:
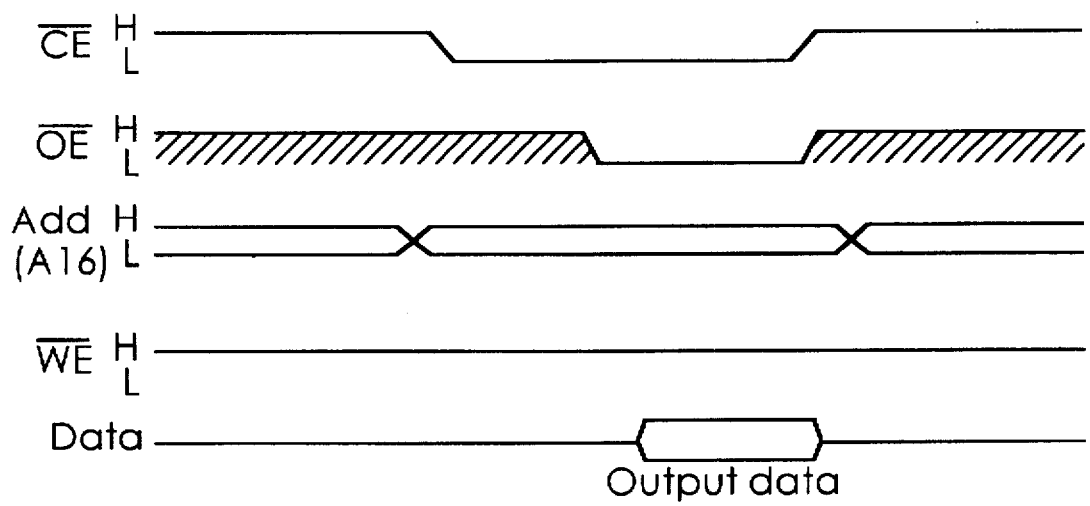
FIG. 14 is a timing diagram illustrating the timing for reading data from a conventional non-volatile semiconductor memory device.
Figure 15:
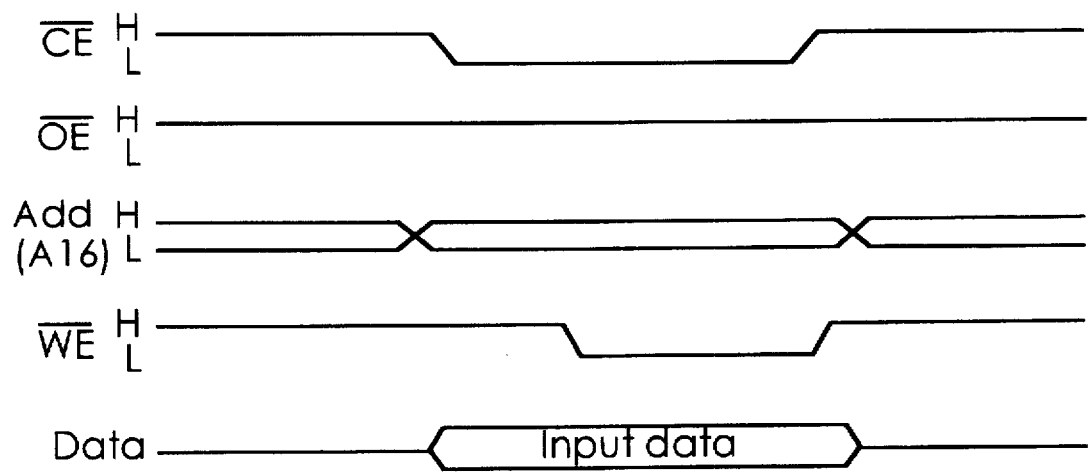
FIG. 15 is a timing diagram illustrating the timing for writing data to a conventional non-volatile semiconductor memory device.

FIG. 12 shows a semiconductor memory device according to Example 4 of the present invention. As shown in FIG. 12, the semiconductor memory device of the present example consists of a package including two complete devices each including an IOB 3, a memory cell array 1 or 2, and an internal control signal generation circuit 11 or 12. Each device has the usual structure in the art of memory devices except that the internal control signal generation circuits 11 and 12 are added. The operation of the circuitry thereof is similar to the operation described in Example 1.

If one of the memory cell arrays is a conventional ROM, no internal control signal generation circuit is required for controlling that memory cell array.

In such a structure, various combinations of memories can be adopted. For example, the combination of a flash RAM as a first memory cell array 1 and a mask ROM as the second memory cell array 2 has an advantage in that the relatively long time required for a read operation of the flash RAM can be utilized for directing the mask ROM for systems that need access to data. Combinations of a ROM and a DRAM, etc. have an advantage in that both chips can be formed in different sections of the same chip, thereby requiring only one chip in situations which would normally require two chips.

As described above, in accordance with the semiconductor memory device having the above configuration, it is possible to access one memory cell array for reading, writing, or erasing data therein while programming the other memory cell array simply by incorporating three control input pins in memory cell arrays for receiving first to third control signal inputs, i.e., without increasing the number of control input pins required in conventional non-volatile semiconductor memory devices and without adding any further address buses or further external input pins corresponding to such address buses in each memory cell array.

Since there is no need to add further external input pins or further control input pins for achieving the above-described control, it possible to use conventionally available packages for the semiconductor memory device according to the specific number of pins required, thereby minimizing any problematic increase in the mount area of the semiconductor memory device. As a result, the semiconductor memory device of the present invention can be easily mounted in various electronic appliances despite its enhanced control of the memory cell arrays.

This means that the storage capacity of the semiconductor memory device can be doubled without increasing its package size. For example, it is possible to accommodate a memory with a capacity of 8M bits (i.e., 4M bits+4M bits) in the same package having the same pin arrangement as that for a memory with a capacity of 4M bits.

Since various combinations of memories can be adopted for the first memory cell array and the second memory cell array, the application range of the semiconductor memory device of the present invention can be further broadened.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a first memory cell array and a second memory cell array for receiving a first control signal, a second control signal, and a third control signal so as to be controlled by the first control signal, the second control signal, and the third control signal,
   wherein data stored in the first memory cell array is read when the first control signal and the second control signal are placed in an enable state, and
   data stored in the second memory cell array is read when the second control signal and the third control signal are placed in an enable state.

2. A semiconductor memory device according to claim 1, wherein data is written to at least one of the first memory cell array and the second memory cell array in accordance with the first control signal and the third control signal.

3. A semiconductor memory device according to claim 2, wherein the first control signal, the second control signal, and the third control signal each take either a first state or a second state.

4. A semiconductor memory device according to claim 3, wherein an interval in which the data is written to the first memory cell array is substantially restricted to a period of time from a point where the third control signal shifts from the first state to the second state until a point where the first control signal shifts from the first state to the second state.

5. A semiconductor memory device according to claim 3, wherein an interval in which the data is written to the second memory cell array is substantially restricted to a period of time from a point where the first control signal shifts from the first state to the second state until a point where the third control signal shifts from the first state to the second state.

6. A semiconductor memory device according to claim 1, wherein the first control signal is CE/WE; the second control signal is OE; and the third control signal is WE/CE.

7. A semiconductor memory device according to claim 1 further comprising a first internal control signal generation circuit and a second internal control signal generation circuit for receiving the first control signal, the second control signal, and the third control signal,
   wherein the first internal control signal generation circuit controls the first memory cell array in accordance with at least two of the first control signal, the second control signal, and the third control signal; and
   the second internal control signal generation circuit controls the second memory cell array in accordance with at least two of the first control signal, the second control signal, and the third control signal.

8. A semiconductor memory device according to claim 1, wherein the first memory cell array and the second memory cell array are a flash RAM and a mask ROM.

9. A semiconductor memory device according to claim 1, wherein the first memory cell array and the second memory cell array are a DRAM and a ROM.

10. A semiconductor memory device according to claim 1, wherein the first memory cell array and the second memory cell array are an SRAM and a ROM.

11. A semiconductor memory device according to claim 1, wherein the first memory cell array and the second memory cell array are a SRAM and a mask ROM.

12. A semiconductor memory device according to claim 1, wherein the first memory cell array and the second memory cell array are a DRAM and a DRAM.

13. A semiconductor memory device according to claim 1, wherein the first memory cell array and the second memory cell array are an SRAM and an SRAM.

14. A semiconductor memory device according to claim 1, wherein the first memory cell array and the second memory cell array are a ROM and a ROM.

* * * * *